United States Patent
Dallmann et al.

(10) Patent No.: US 8,580,687 B2
(45) Date of Patent: Nov. 12, 2013

(54) SEMICONDUCTOR STRUCTURE AND METHOD FOR MAKING SAME

(75) Inventors: Gerald Dallmann, Dresden (DE); Dirk Meinhold, Dresden (DE); Alfred Vater, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/894,189

(22) Filed: Sep. 30, 2010

(65) Prior Publication Data

US 2012/0080795 A1    Apr. 5, 2012

(51) Int. Cl.
*H01L 21/44* (2006.01)

(52) U.S. Cl.
USPC ........... 438/687; 438/618; 438/627; 438/637; 438/645; 438/690; 257/751; 257/758; 257/762; 257/767; 257/E21.586

(58) Field of Classification Search
None
See application file for complete search history.

(56) References Cited

U.S. PATENT DOCUMENTS

| | | | | |
|---|---|---|---|---|
| 6,150,723 | A | * | 11/2000 | Harper et al. ............... 257/762 |
| 6,555,461 | B1 | | 4/2003 | Woo et al. |
| 6,624,066 | B2 | * | 9/2003 | Lu et al. ..................... 438/643 |
| 2001/0027019 | A1 | * | 10/2001 | Ishii et al. .................... 438/690 |
| 2004/0048461 | A1 | * | 3/2004 | Chen et al. .................. 438/629 |
| 2006/0019485 | A1 | * | 1/2006 | Komai et al. ............... 438/627 |
| 2006/0060971 | A1 | | 3/2006 | Ning |
| 2006/0194430 | A1 | * | 8/2006 | Beck ........................... 438/627 |
| 2007/0026631 | A1 | | 2/2007 | Lin |
| 2009/0079080 | A1 | | 3/2009 | Stecher |

* cited by examiner

*Primary Examiner* — Kyoung Lee
(74) *Attorney, Agent, or Firm* — Infineon Technologies AG; Philip H. Schlazer (57) ABSTRACT

One or more embodiments relate to a method for forming a semiconductor structure, comprising: providing a workpiece; forming a dielectric barrier layer over the workpiece; forming an opening through the dielectric barrier layer; forming a seed layer over the dielectric barrier layer and within the dielectric barrier layer opening; and electroplating a first fill layer on the seed layer.

28 Claims, 11 Drawing Sheets

SEMICONDUCTOR STRUCTURE AND METHOD FOR MAKING SAME

FIELD OF THE INVENTION

One or more embodiments relates to semiconductor structure and methods for making semiconductor structures.

BACKGROUND OF THE INVENTION

Chips in certain technologies may include electronic devices and circuits that may require metallization having various thickness and/or widths. New ways of making metallization are needed.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
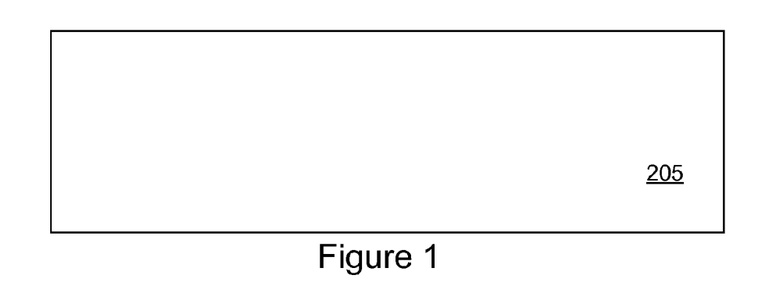
FIGS. 1 through 20 show a method for making a semiconductor structure in accordance with an embodiment of the present invention.

FIG. 1 shows a workpiece 205. In one or more embodiments, the workpiece 205 may be a homogeneous layer. In one or more embodiments, the workpiece 205 may include or may be a dielectric layer. In one or more embodiments, the workpiece 205 may comprise a dielectric material. In one or more embodiments, the workpiece 205 may include two or more sub-layers of different materials. In one or more embodiments, the workpiece 205 may include a substrate such as a semiconductor substrate.

Figure 2:
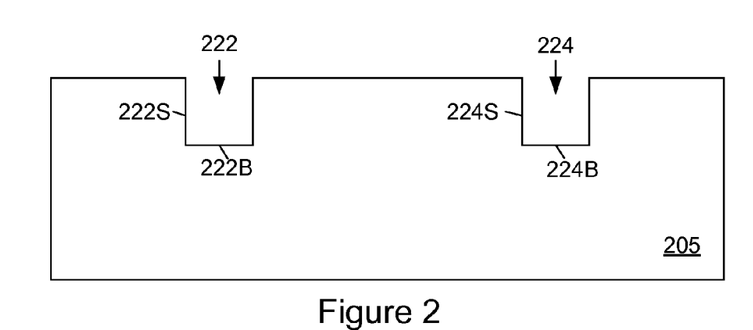

Referring to FIG. 2, openings 222 and 224 are each formed within the workpiece 205 so that the workpiece 205 includes the openings 222 and 224. The openings 222 and 224 may each have any lateral cross sectional shape and may be in the form of holes or trenches. The workpiece 205 may include one or more openings.

Figure 3:
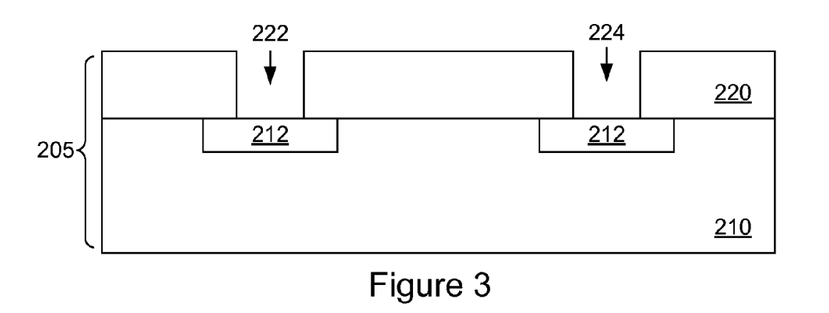

Referring to FIG. 3, in one or more embodiments, the workpiece 205 may comprise a layer 210 and a layer 220 overlying the layer 210.

In one or more embodiments, the layer 210 may include conductive regions 212. In one or more embodiments, the layer 220 may be a dielectric layer. The dielectric layer 220 may comprise one or more dielectric materials selected from the group consisting of oxide, nitride, oxynitride. The dielectric layer may include mixtures and combinations of materials.

In one or more embodiments, the openings 222, 224 may be formed within the layer 220. Referring to FIG. 3, in one or more embodiments, the openings 222 and 224 may be formed within the layer 220 (for example, through the layer 220) so as expose the layer 210. The opening 222 may include a bottom surface 222B and at least one sidewall surface 222S. The opening 224 may include a bottom surface 224S and at least one sidewall surface 224S. In one or more embodiments, the openings 222, 224 may be holes. In one or more embodiments, the openings 222, 224 may be trenches. In one or more embodiments, the openings 222, 224 may expose the conductive regions 212.

Figure 4:
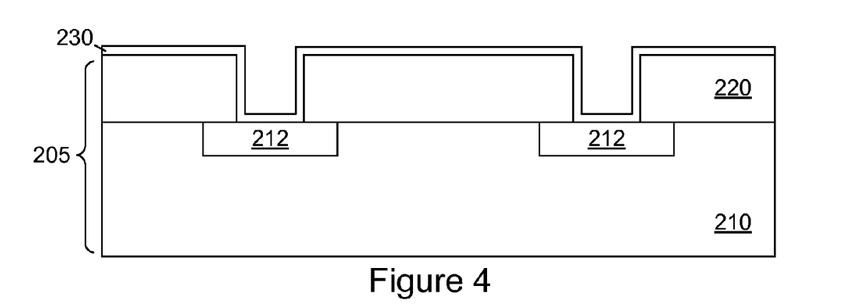

Referring to FIG. 4, a barrier layer 230 may be formed over the layer 220 and within openings 222, 224. The barrier layer 230 may be formed over the sidewall and bottom surfaces of each of the openings 222 and 224. In one or more embodiments, the barrier layer 230 may be formed directly on the layer 220 and directly on the sidewall and bottom surfaces of openings 222, 224. The barrier layer 230 may be formed by a deposition process such as by a substantially conformal deposition process. The barrier layer 230 may be a dielectric barrier layer. In one or more embodiments, the barrier layer 230 may comprise an oxide, a nitride and/or an oxynitride. The barrier layer 230 may, for example, comprise one or more material selected from the group consisting of silicon dioxide, silicon nitride, a silicon oxynitride, and combinations thereof. In one or more embodiments, the barrier layer 230 may comprise one or more materials selected from the group consisting of SiN, SiON, SiC, SiO, $SiO_2$, and combinations thereof. In one or more embodiments, the dielectric barrier layer 230 may include a silicon nitride material such as an HDP-silicon nitride or a UV-silicon nitride. In one or more embodiments, the barrier layer 230 may be a homogeneous layer. In one or more embodiments, the barrier layer 230 may comprise a combination or mixture of two or more dielectric materials. In one or more embodiments, the barrier layer 230 may comprise two or more sub-layers of different materials.

Figure 5:
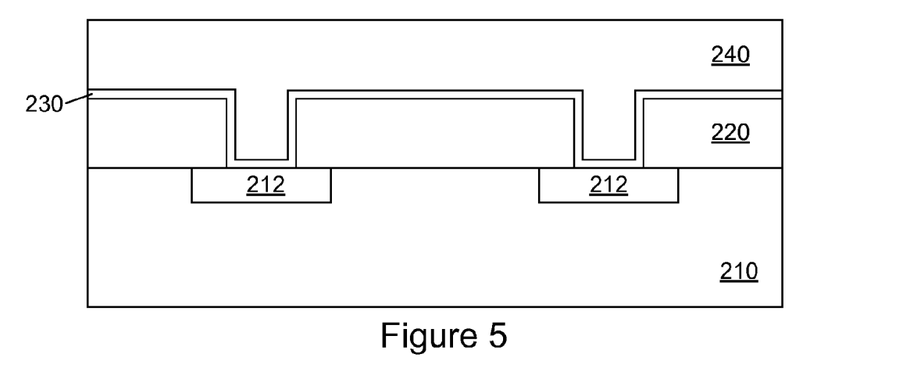

Referring to FIG. 5, a masking layer 240 may be formed over the barrier layer 230. The masking layer layer 240 may be formed within the openings 222 and 224.

Figure 6:
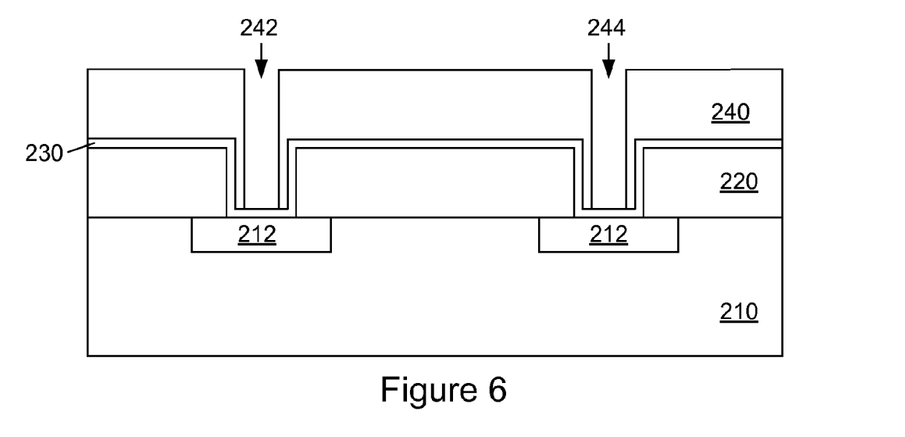

Referring to FIG. 6, the masking layer 240 may be patterned so as to form openings 242 and 244 through the masking layer 240 so as to expose the barrier layer 230. Opening 242 is formed within opening 222 while the opening 244 is formed within opening 224. In one or more embodiments, the openings 242, 244 may be trenches. In one or more embodiments, the openings 242, 244 may be holes. In one or more embodiments, the masking layer 240 may be a photoresist layer. In one or more embodiments, the photoresist may comprise a galvanic photoresist.

Figure 7:
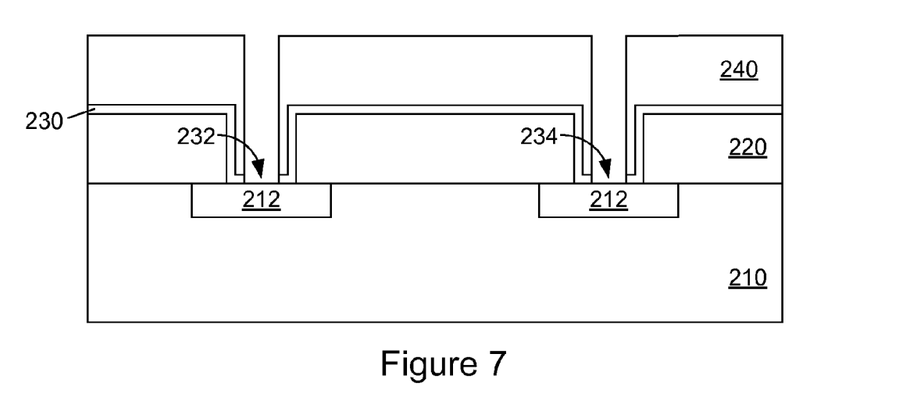

Referring to FIG. 7, the patterned masking layer 240 is used as a mask to etch the barrier layer 230 and form openings 232 and 234 through the barrier layer 230. The opening 232 and 234 may expose the bottoms surfaces 222B, 224B (as shown in FIG. 2) of openings 222, 224, respectively. With reference to layer 210, the openings 232, 234 may expose the layer 210 (for example, conductive regions 212 of layer 210).

Figure 8:
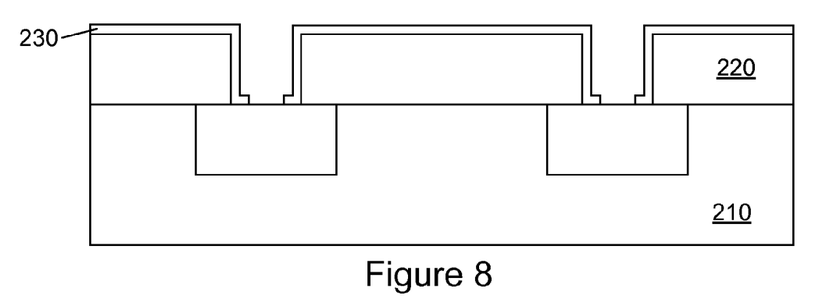

Referring to FIG. 8, the masking layer 240 from FIG. 7 may then be removed. This leaves the structure shown in FIG. 8.

Figure 9:
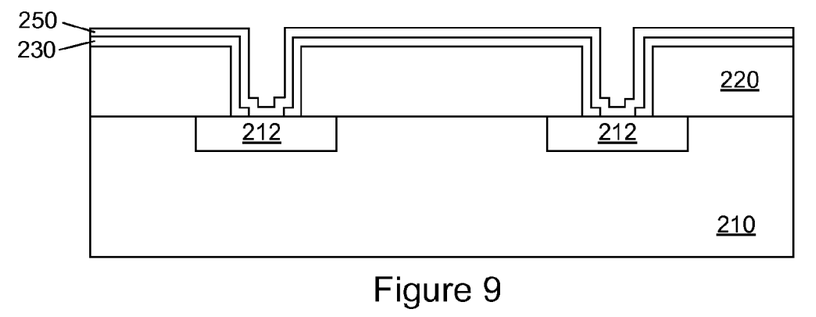

Referring to FIG. 9, a seed layer 250 may then be formed over the barrier layer 230. In one or more embodiments, the seed layer 250 may be a conductive layer such as a metallic layer. The seed layer 250 may formed within the openings 222 and 224. In addition, the seed layer 250 may be formed within the openings 232, 234 of the barrier layer 230. The seed layer 250 may make electrical contact with the layer 210. In one or more embodiments, the seed layer 250 may make direct contact with the layer 210. The seed layer 250 may be formed by a deposition process. The deposition process may be a substantially conformal deposition process. The seed layer may be formed by a chemical vapor deposition process or a physical vapor deposition process.

Figure 10:
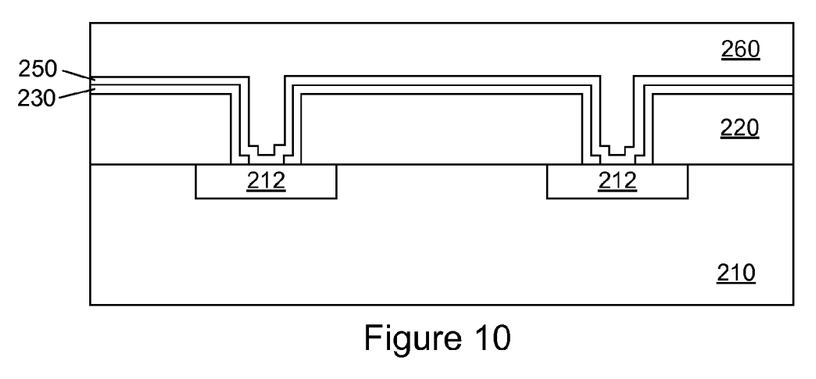

Referring to FIG. 10, a masking layer 260 may then be deposited over the seed layer 250. The masking layer 260 may be formed within the openings 222 and 224. In one or more embodiments, the masking layer 260 may be a photoresist layer. The photoresist layer may comprise a galvanic photoresist.

Figure 11:
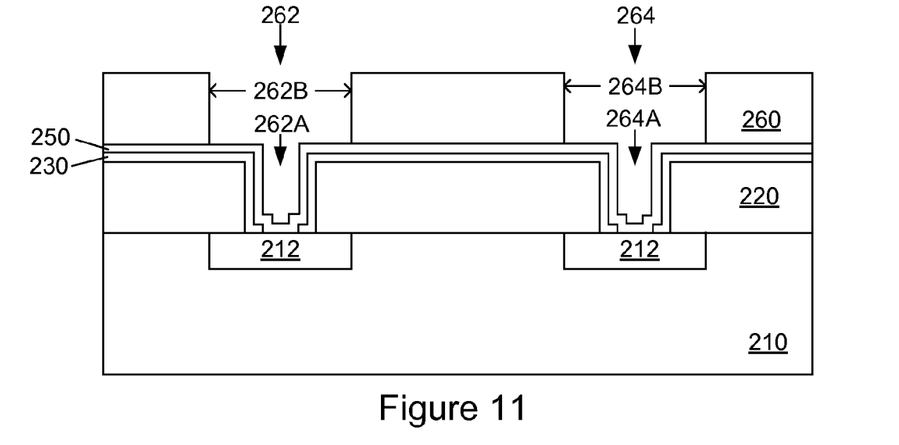

Referring to FIG. 11, the masking layer 260 may then be patterned by removing one or more portions of the masking layer 260. The patterning of the masking layer 260 creates openings 262 and 264. Each of the openings 262 and 264 may be multi-tiered structures. Each of the openings may include an upper portion and a lower portion. The opening 262 includes an upper portion 262B and a lower portion 262A. Likewise, the opening 264 includes an upper portion 264B and a lower portion 264A. The lower portions 262A, 264A may be formed within openings 222, 224, respectively. The lower portions 262A, 264A may be trenches or holes. The upper portions 262B, 264B may be formed as trenches or holes. In one or more embodiments, the upper portions 262B, 264B may be formed as trenches while the lower portions 262A, 264A may be formed as holes (for example, via holes). In one or more embodiments, the upper portions 262B, 264B may be formed as holes while the lower portions 262A, 264A may be formed as trenches. In one or more embodiments, the upper portions 262B, 264B may be formed as holes while the lower portions 262A, 264A may be formed as holes. In one or more embodiments, the upper portions 262B, 264B may be formed as trenches while the lower portions 262A, 264A may be formed as trenches.

Figure 12:
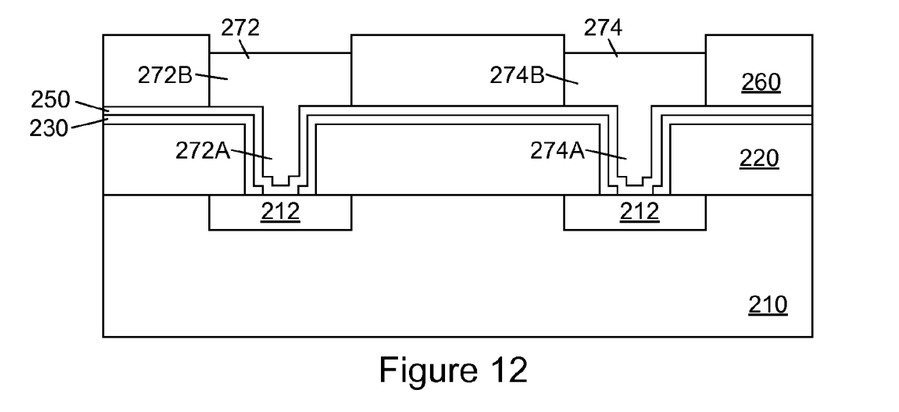

Referring to FIG. 12, first fill layers 272, 274 are formed within openings 262, 264 respectively. The first fill layers 272, 274 may be formed by a deposition process. The deposition process may be an electroplating process. Hence, in one or more embodiments, the first fill layers 272, 274 may be formed by an electroplating process. In some embodiments, the first fill layers 272, 274 may be formed at or below the top of the openings 262, 264. However, it may also be possible that, in some embodiments, the first fill layers 272, 274 go above the top of the openings 262, 264. The first fill layers 272, 274 may be conductive layer such as metallic layers. The first fill layers 272, 274 may electroplate onto the seed layer 230.

Referring to FIG. 12, each of the first fill layers 272, 274 may include a lower portion 272A and an upper portion 272B. For example, the first fill layer 272 includes a lower portion 272A formed within the lower portion 262A of opening 262 and an upper portion 272B formed within the upper portion 262B of opening 262. Likewise, the first fill layer 274 includes a lower portion 274A formed within the lower portion 264A of opening 264 and an upper portion 274B formed within the upper portion 264B of opening 264.

Figure 13:
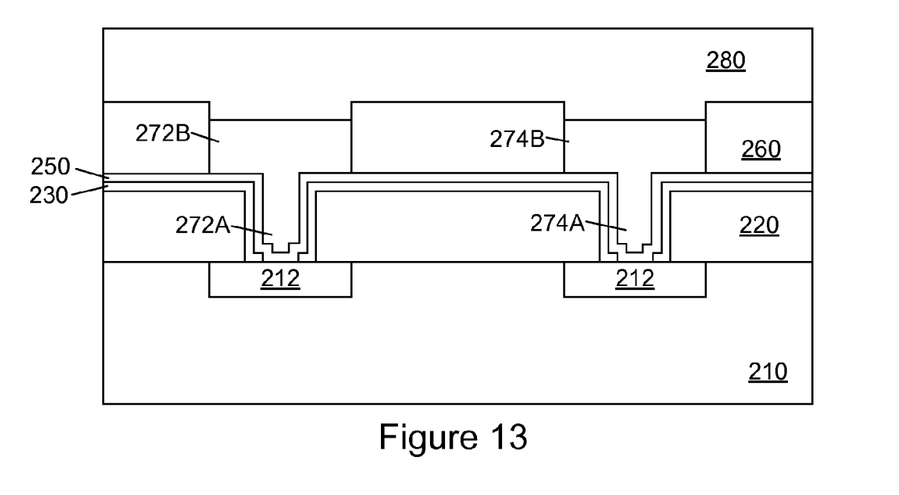

Referring to FIG. 13, a masking layer 280 may be deposited over the structure shown in FIG. 12 to form the structure shown in FIG. 13. The masking layer 280 may be formed over the remaining portions of masking layer 260 as well as the first fill layers 272,274. In another embodiment, it is possible that the masking layer 260 is removed prior to the deposition of the masking layer 280. In one or more embodiments, the masking layer 280 may be a photoresist layer. In one or more embodiments, the photoresist layer may include a galvanic photoresist.

Figure 14:
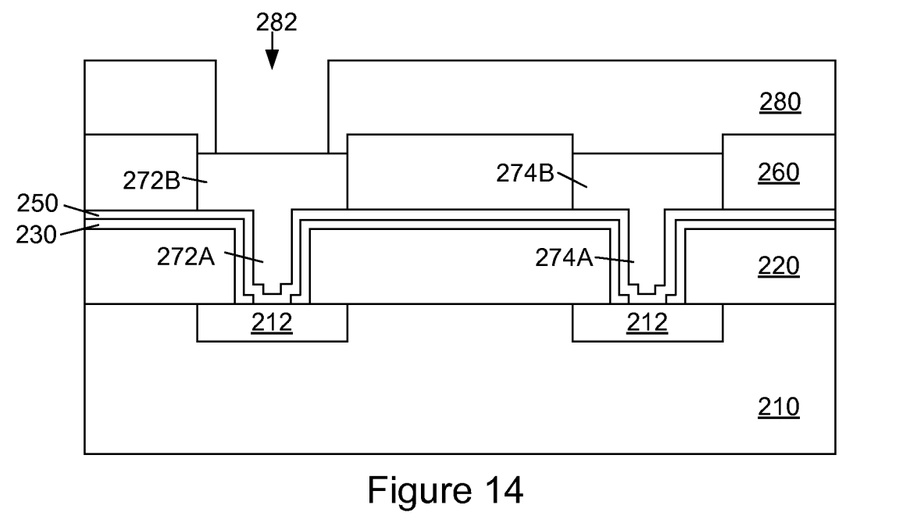

Referring to FIG. 14, the masking layer 280 may be patterned such that an opening 282 may be formed over the first fill layer 272. The opening 282 may be formed so as to expose the first fill layer 272. The opening 282 may be a trench or a hole. In the embodiment shown, an opening is not formed over the first fill layer 274. However, in another embodiment, another opening may be formed over the first fill layer 274.

In one or more embodiments, the masking layer 280 and/or the masking layer 260 and/or the masking layer 240 may comprise a galvanic resist.

Figure 15:
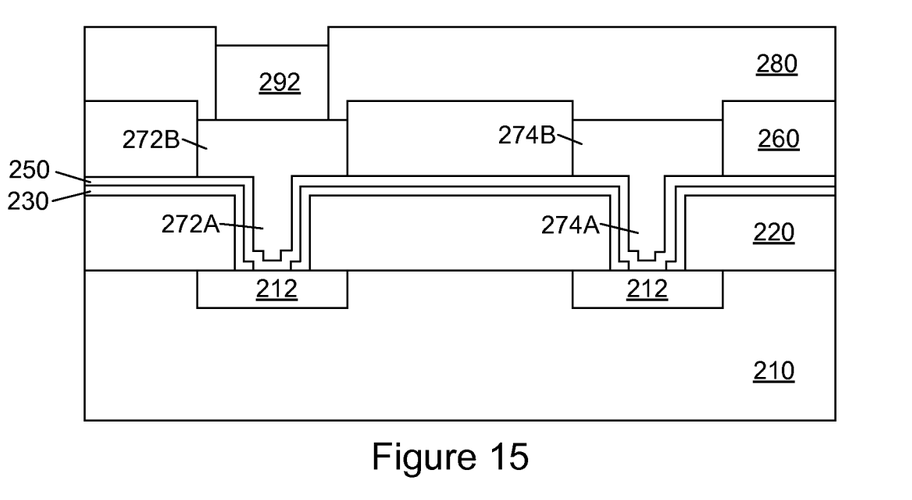

Referring to FIG. 15, a second fill layer 292 may be formed within the opening 282 and over the first fill layer 272. The second fill layer 292 may be a conductive layer such as a metallic layer. The second fill layer 292 may be in electrical contact with the first fill layer 272. In one or more embodiments, the second fill layer 292 may be in direct contact with the first fill layer 272. The second fill layer 292 may be formed by a deposition process. The deposition process may be an electroplating process. Hence, in one or more embodiments, the second fill layer 292 may be deposited by an electroplating process such that the second fill layer 292 is electroplated onto the first fill layer 272.

Figure 16:
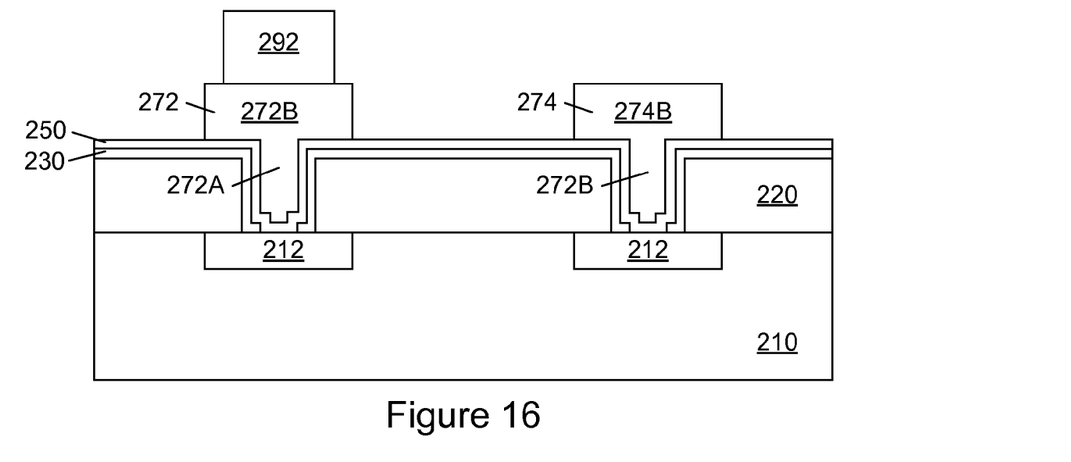

Referring to FIG. 16, the masking layer 280 and the masking layer 260 may both be removed. Removal may be accomplished by an etching process. The etching process may comprise a wet etching process. In one or more embodiments, the removal process may include a plasma strip or plasma etching process.

Figure 17:
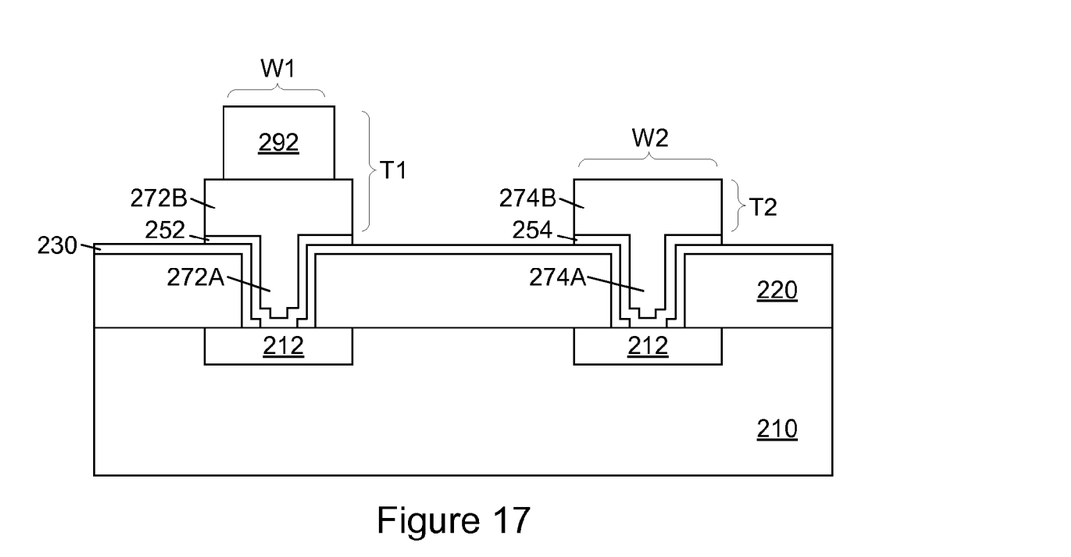

Referring to FIG. 17, the exposed portions of the seed layer 250 may be removed. The exposed portions may include those portions not underlying the first fill layers 272, 274 or the second fill layer 292. Removing the exposed portions of the seed layer 250 may serve to electrically isolate the layers 272, 292 from the layer 274. In other embodiments, it may be possible that the seed layer is allowed to remain as shown in FIG. 16.

As described herein, a layer (A, B, C) refers to the combination of layer A, layer B and layer C. For example, referring to FIG. 17, layer (292, 272B, 272A) refers to the combination of layer 292, layer 272B and layer 272A. It is noted that each portion 272A and 272B of layer 272 may be referred to as a layer 272A and a layer 272B. Feature (292, 272B) refers to the combination of layer 292 and layer 272B. The layer (274B, 274A) refers to the combination of layer 274B and layer 274A.

A semiconductor structure, such as a semiconductor chip or integrated circuit may include one or more metallization levels. A metallization level may, for example, be metal-1, metal-2, metal-3, etc. Likewise, the metallization level may be the final or top metallization level.

A metallization level may include one or more spacedly disposed conductive portions. For example, a metallization level may include two or more spacedly disposed portions. In some embodiments, one conductive portion may be electrical isolated from another conductive portion.

A metallization level may include one or more metal lines. A metal line may have any shape. A metallization level may include at least one metal line. A metallization level may include two or more spaced apart metal lines. Two or more metal lines of a metallization level may be electrically isolated from each other. In some embodiments, metal line may be useful for directing electrical signals primarily in a horizontal direction.

A metal line may include a pad structure. The pad structure may be referred to as a bond pad, a contact pad and/or a landing pad.

Referring to FIG. 17, it is possible that the layers 272A, 272B, 292, 274A, 274B, either alone or combination represent a variety of features. Referring to FIG. 17, the layer (292, 272B) may represent a first metal line of a metallization level. Likewise, layer 274B may represent a second metal line belonging to the same metallization level. The layer (292, 272B) may have a thickness T1 and a width W1. The layer 274B may have a thickness T2 and a width W2. In one or more embodiments, the thickness T1 may be greater than the thickness T2. In one or more embodiments, the width W1 may be greater than the width W2. Hence, in one or more embodiments, a metallization level may be formed (such as a final metallization level) that includes at least two metal lines having different thicknesses and/or different widths.

In some embodiments, it is possible that layer 272B may represent a metal line while layer 292 may represent a bond pad that overlies a metal line 272B. In some embodiments, it is possible that layer 272B represents a metal line while layer 292 represents an under-bump metallization.

In some embodiments, layer 272A and layer 274A may, for example, represent conductive vias. A conductive via may couple one metallization level to another metallization level. A conductive via may couple a metallization level (such as metal-1) to a substrate. A conductive via that electrically couples a metallization level to a substrate may be referred to as a conductive contact. In some embodiments, conductive vias (or conductive contacts) may be useful for directing electrically signals in a substantially vertical direction.

Figure 18:
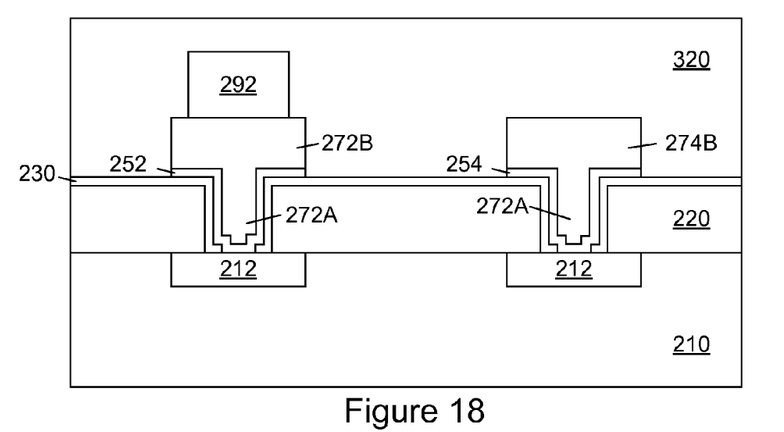

Referring to FIG. 18, a dielectric layer 320 may be formed over the structure shown in FIG. 17 to form the structure shown in FIG. 18. The dielectric layer 320 may be formed over the layer (292, 272B) and layer 274B. In some embodiments, the dielectric layer 320 may serve as a passivation layer.

In one embodiment, the dielectric layer 320 may comprise an imide such as a polyimide. In other embodiments, the dielectric layer 320 may comprise an oxide, a nitride or an oxynitride. The dielectric layer 320 may, for example, be formed of silicon dioxide, silicon nitride, a silicon oxynitride or combinations thereof. In one or more embodiments, the dielectric layer 320 may comprise one or more materials selected from the group consisting of SiN, SiON, SiC, SiO, $SiO_2$, and combinations thereof.

Figure 19:
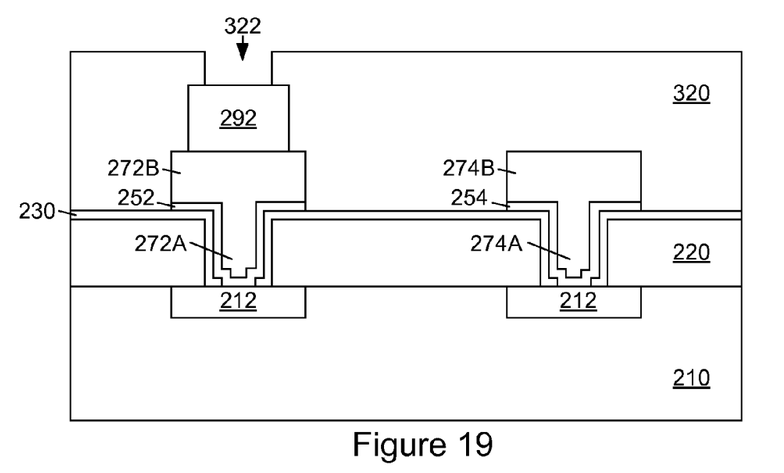

Referring to FIG. 19, an opening 322 may, optionally, be formed in the dielectric layer 320. The openings 322 may expose top surface of layer 292.

Figure 20:
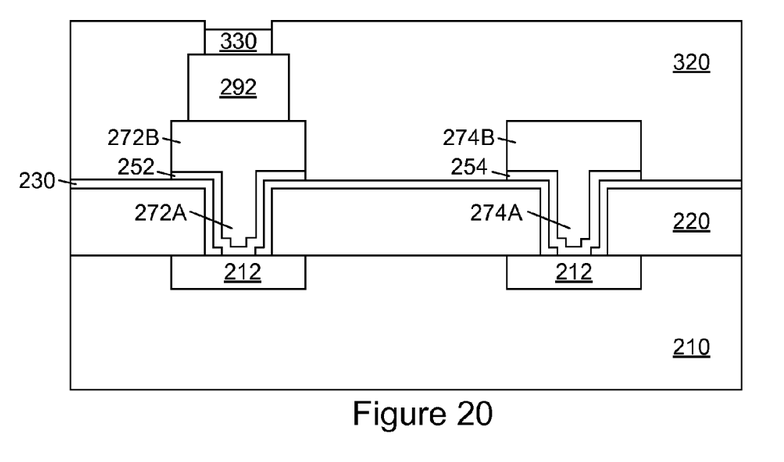

Referring to FIG. 20, a layer 330 may then be disposed within the opening 322 and on top of the exposed metallic material of layer 292. The layer 330 may comprise a metallic material. In some embodiments, the layer 330 may be a homogeneous layer of a metallic material. The layer 330 may be a stack including two or more sub-layers of different materials. For example, the material may include two layers such as NiP/Pd (a Pd layer over a NiP layer) or NiMoP/Pd (a Pd layer over a NiMoP layer). As another example, the material may include three layers such as NiP/Pd/Au (an Au layer over a Pd layer over a NiP layer) or NiMoP/Pd/Au (an Au layer over a NiMoP layer over a NiMoP layer). It is possible that more than three layers be used. The layer 330 may serve as a pad structure when, for example, the layer (292, 272B) may serve as an final metal line. The layer 330 may serve as an additional pad structure when, for example, the layer 272B represents a final metal line and the layer 292 serves as a bond pad overlying the final metal line 272B.

Figure 24:
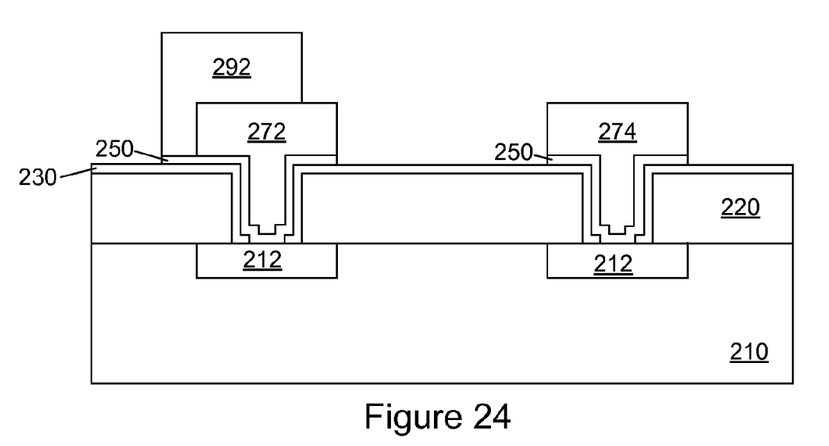

FIG. 24 shows another embodiment. Referring to FIG. 24, the second fill layer 292 overlies the layer 272. Likewise, the second fill layer 292 overlies layer 272B.

In the embodiment shown in FIG. 24, a portion of the layer 292 covers a portion of the layer 272. In one or more embodiments, a portion of layer 292 may cover all of layer 272. In one or more embodiments, all of layer 292 may cover a portion of layer 272. In one or more embodiments, all of layer 292 may cover all of layer 272. Hence, in one or more embodiments, at least a portion of layer 292 may cover at least a portion of layer 272.

Figure 21:
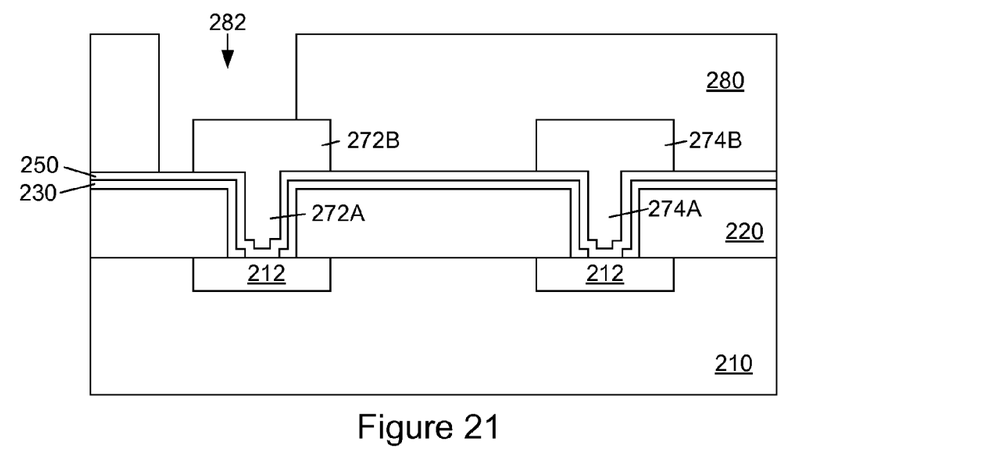
FIGS. 21 through 24 show a method for making a semiconductor structure in accordance with an embodiment of the present invention.

Referring to FIG. 21, it is seen that, in one or more embodiments, the opening 282 may be formed within the masking layer 280 so that it exposes a portion of the layer 272 (or a portion of layer 272B) and a portion of the seed layer 250).

Figure 22:
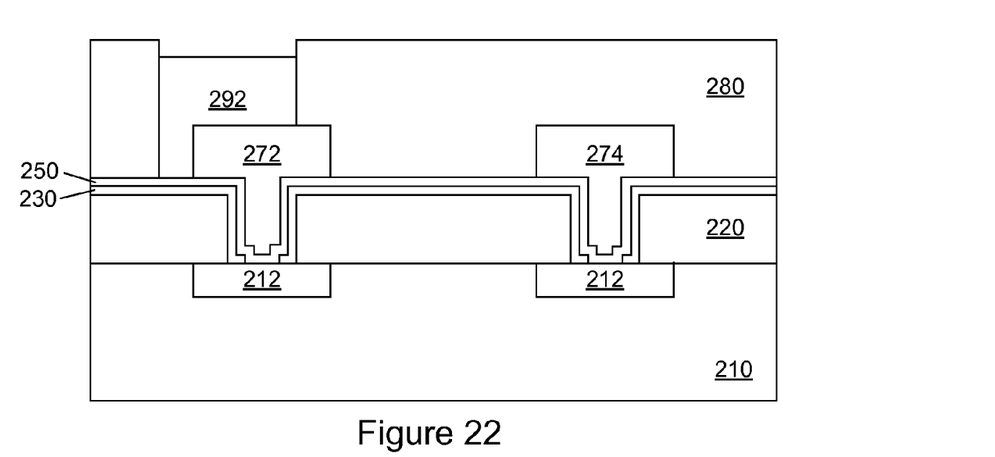

FIG. 22 shows that the second fill layer 292 may be formed within the opening 282.

Figure 23:
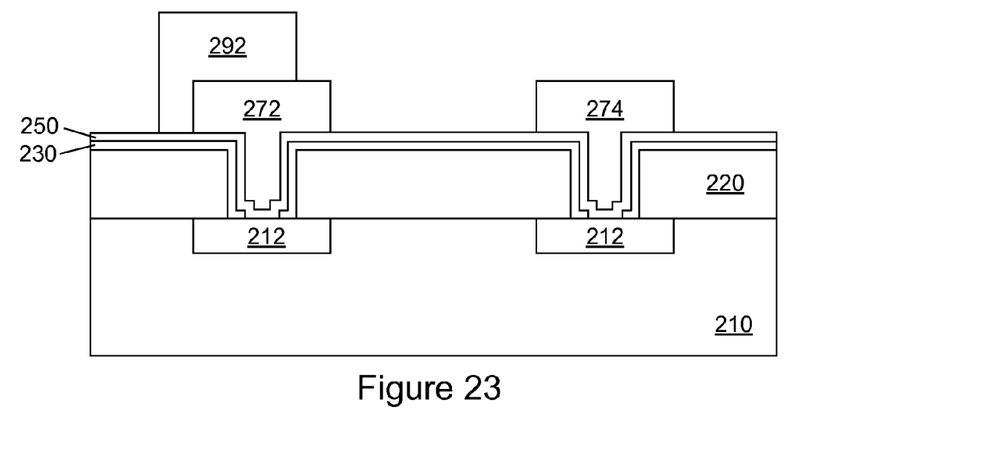

FIG. 23 shows that the masking layer 280 may be removed.

FIG. 24 shows that a portion of the seed layer 250 may be removed so that layer (292, 272) is electrically isolated from layer 274.

Referring to FIG. 24, in one or more embodiments, it is possible that the layer 210 may represent a substrate (such as a semiconductor substrate). The substrate may include conductive regions 212.

Figure 25:
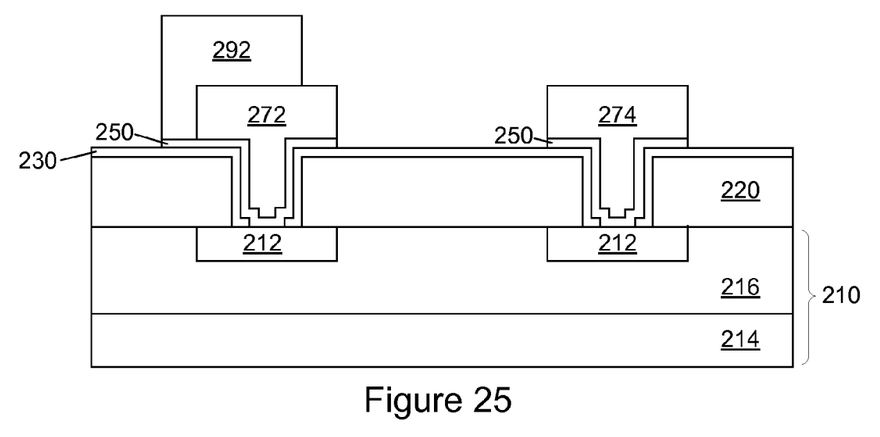
FIG. 25 shows a semiconductor structure in accordance with an embodiment of the present invention.

FIG. 25 shows that, in or more embodiments, the layer 210 may comprise a layer 216 overlying a layer 214. Layer 214 may represent a substrate such as a semiconductor substrate. Hence, the layer 210 may represent a layer 216 over a substrate 214. The layer 216 may itself include one or more metallization levels. The conductive regions 212 may, for example, represent metal lines of a metallization level.

It is noted that a substrate may be a semiconductor substrate such as a bulk-semiconductor substrate or an SOI substrate (e.g. a semiconductor on insulator substrate). The bulk-semiconductor substrate may be a bulk-silicon substrate. The SOI substrate may be a silicon on insulator substrate.

Referring again to FIGS. 1 through 15, additional embodiments of the invention may be described. For example, in some embodiments, it may be possible to electroplate first fill layers 272, 274 without using first masking layer 260 (and without openings 262, 264). Likewise, in some embodiments, it may be possible to electroplate second fill layer 292 without using second masking layer 280 (and without opening 282).

Referring to FIG. 15, in another embodiment, it may be possible to remove masking layer 260 before forming the masking layer 280.

Figure 26A:
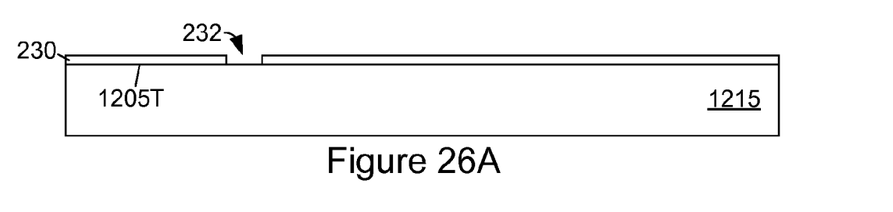
FIGS. 26A through 26F show a method for making a semiconductor structure in accordance with an embodiment of the present invention.

FIGS. 26A through 26F show a process for making a semiconductor structure in accordance with embodiments of the invention. In this embodiment, the openings 222, 224 as shown in FIG. 2 need not be formed. FIG. 26A shows a workpiece 1215. Workpiece 1215 may correspond to any workpiece. In one or more embodiments, the workpiece 1215 may be different from workpiece 205 shown in FIG. 1. In one or more embodiments, the workpiece 1215 may correspond to workpiece 205. In one or more embodiments, the workpiece 1215 may correspond to layer 210. In one or more embodiments, the workpiece 1215 may correspond to some other workpiece.

Figure 26B:
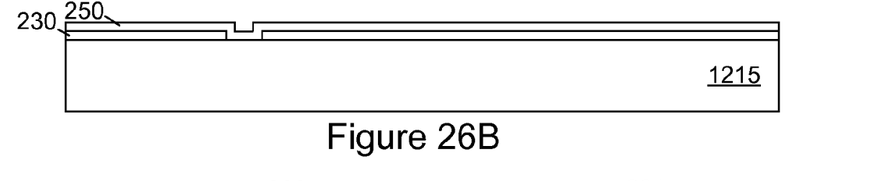
Figure 26C:
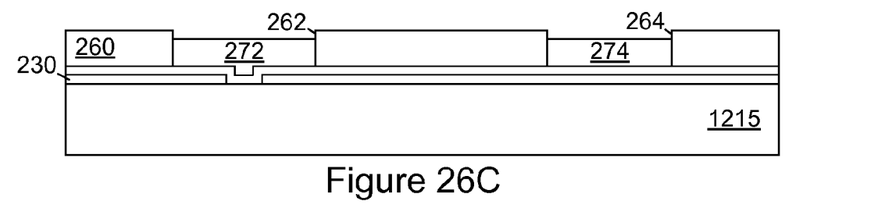
Figure 26D:
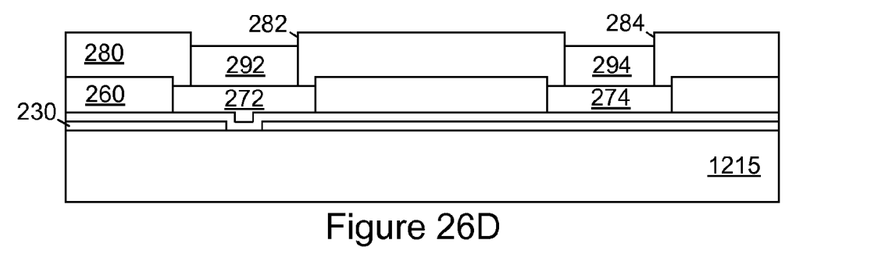
Figure 26E:
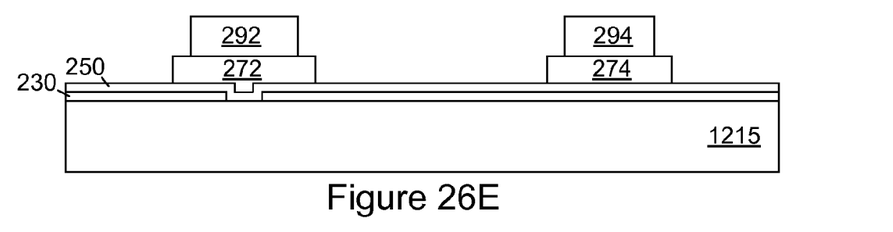
Figure 26F:
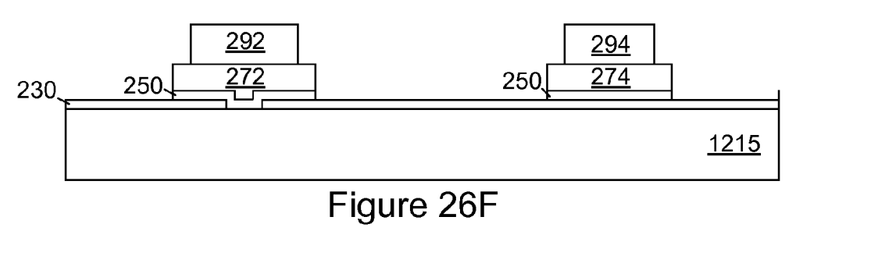

The workpiece 1215 includes a top surface 1215T. A barrier layer 230 may be disposed over the workpiece 1205 (e.g. over the top surface 205T of the workpiece 1205). In one or more embodiments, the barrier layer 230 may be a dielectric barrier layer. In one or more embodiments, the barrier layer 230 may be disposed directly on the workpiece 1215. An opening 232 may be formed through the dielectric barrier layer 230. This may be done through by using masking layer (for example, a photoresist layer) and a dry etch process (similar to that shown in FIG. 6). FIG. 26B shows a seed layer 250 formed over the barrier layer 230 and within the opening 232. The seed layer 250 may be is direct contact with the workpiece 1215. FIG. 26C shows that a masking layer 260 (for example, a photoresist layer) may be formed over the seed layer 230 and may be patterned to from openings 262, 264. FIG. 26C also shows that first fill layers 272, 274 may be electroplated onto the seed layer 250 within the patterned openings 262, 264. FIG. 26D shows that a masking layer 280 (for example, a photoresist layer) may be formed over the structure shown in FIG. 26C. The masking layer 280 may be patterned to form openings 282, 284. FIG. 26D also shows that second fill layers 292, 294 may be electroplated onto the first fill layers 272, 274, respectively. FIG. 26E shows the removal of the masking layers 260, 280. FIG. 26F shows the removal of portions of the seed layer 250. This electrically isolates the layer (292, 272) from the layer (294, 274). In another embodiment, it is possible that the masking layer 260 may be removed prior to the deposition of masking layer 280.

Referring again to FIGS. 26A through 26F, additional embodiments of the invention may be described. For example, in some embodiments, it may be possible to electroplate first fill layers 272, 274 without using first masking layer 260 (and without openings 262, 264). Likewise, in some embodiments, it may be possible to electroplate second fill layers 292, 294 without using second masking layer 280 (and without openings 282, 284).

Figure 26G:
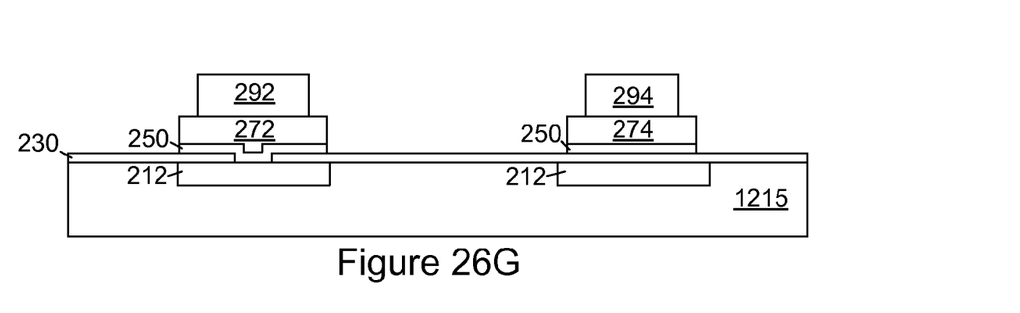
FIG. 26G shows a semiconductor structure in accordance with an embodiment of the present invention.

Referring to FIG. 26G, in one or more embodiments, it is possible that the workpiece 1215 may represent a substrate (such as a semiconductor substrate). The substrate may include conductive regions 212.

Figure 26H:
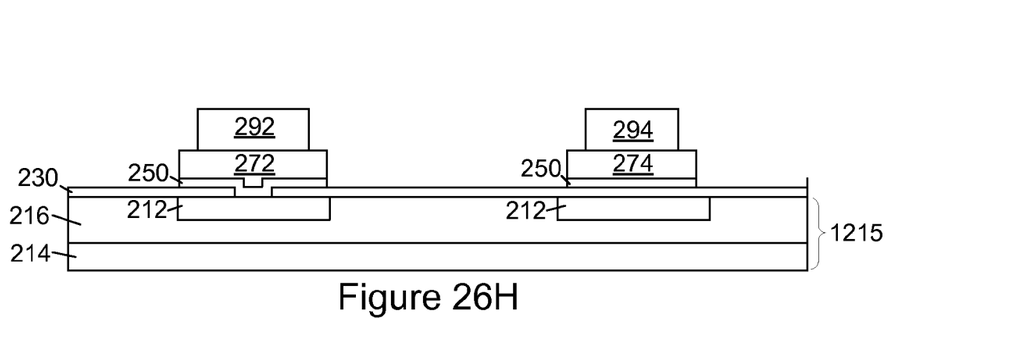
FIG. 26H shows a semiconductor structure in accordance with an embodiment of the present invention.

Referring to FIG. 26H, in or more embodiments, the workpiece 1215 may comprise a layer 216 overlying a layer 214. Layer 214 may represent a substrate such as a semiconductor substrate. Hence, the workpiece 1215 may represent a layer 216 over a substrate 214. The layer 216 may itself include one or more metallization levels. The conductive regions 212 may, for example, represent metal lines of a metallization level.

In one or more embodiments, all of the concepts described above may be useful for the formation of a final or top metallization level and for the formation of final or top metal lines of a semiconductor chip or integrated circuit. However, it is understood that the discussion is applicable to the metallization layer of any metallization level of a semiconductor structure. The semiconductor structure may represent semiconductor chip and/or integrated circuit and/or a semiconductor device. In one or more embodiments, metallization levels may, for example, be referred to as Metal-1, Metal-2, and so on.

The seed layer 250, the first fill layers 272, 274, the second fill layers 292, 294, the layer 212 may each be conductive layers. One or more of these layers may be metallic layers. The seed layer 250, the first fill layers 272, 274, the second fill layers 292, 294, the layer 212 may include one or more conductive materials. A conductive material may be a metallic material. The metallic material may, for example, be a metal, alloy or compound. In one or more embodiments, the metallic material may comprise one or more periodic table chemical elements from the group consisting of Cu (copper), Au (gold), Ag (silver), Al (aluminum), and W (tungsten).

The seed layer 250, the first fill layers 272, 274, the second fill layers 292, 294, conductive layers 212 (as well as any other conductive layer) may include one or more materials from the group consisting of copper metal, gold metal, silver metal, aluminum metal, tungsten metal, titanium metal, tantalum metal, copper alloy, gold alloy, silver alloy, aluminum alloy, tungsten alloy, titanium alloy, tantalum alloy, titanium nitride, tantalum nitride, and tungsten nitride. Combinations or mixtures of materials may also be used. In some embodiments, one or more of the layers may be formed as a homogeneous layer. One or more of the layers may itself be formed as a stack of layer including two or more sub-layers. Two or more of the sub-layers may include different materials.

In one or more embodiments, it is possible that one or more of the conductive layers described above may include non-metallic conductive materials such as doped silicon. The doped silicon may, for example, be doped polysilicon or doped monocrystalline silicon.

In one or more embodiments, the first fill layers 272, 274 as well as the second fill layers 292, 294 may include copper metal and/or copper alloy. In one or more embodiments, the seed layer 250 may include copper metal and/or copper alloy. In one or more embodiments, the first fill layers 272, 274 as well as the second fill layers 292, 294 may comprise any electroplatable material.

In one or more embodiments may be a semiconductor structure (e.g. a semiconductor chip and/or integrated circuit and/or semiconductor device) having a metallization layer comprising a plurality of metal lines having a plurality of thicknesses. The metal lines may all be spacedly disposed from each other. The metal lines may all be electrically isolated from each other. In one or more embodiments, the final metal layer may include a plurality of metal lines having the same thickness. The metallization layer may be a final or top metal layer. The metal lines may be final or top metal lines.

It is noted that the metal lines (such as final metal lines) as described herein may have any widths. In one or more embodiments, the thicker metal lines may have a wider width than a thinner line. However, this does not have to be the case. It may also be possible that a thicker line be narrower than a thinner line.

As an example, the metallization level (such as final or top metallization level) may have at least one thicker metal line and at least one thinner metal line. In one or more embodiments, there may be at least two thicker metal lines. In one or more embodiments, there may be at least one thin metal line. The thicker and thinner metals may all be spacedly disposed from each other. The thicker and thinner metal lines may all be electrically isolated from each other.

A semiconductor device and/or a semiconductor chip and/or a semiconductor structure having a metallization layer (such as a final or top metallization level) with a plurality of metal lines (such as final or top metal lines) with a plurality of thicknesses (for example, with both thicker and thinner metal lines) may have many applications. For example, semiconductor devices and chips in Smart Power technologies may include DMOS transistors which require relatively thick metal lines (such as final metal lines). Such lines may require a relatively wide pitch (distance between lines). On the other hand, the same semiconductor devices and chips may include logic applications which require a metallization system with a relatively fine or narrow pitch. For the logic applications, thinner metal lines (such as thinner final metal lines) may be better suited so as to accommodate a finer pitch.

One or more embodiments relate to a method for forming a semiconductor structure, comprising: providing a workpiece; forming a dielectric barrier layer over the workpiece; forming an opening through the dielectric barrier layer; forming a seed layer over the dielectric barrier layer and within the dielectric barrier layer opening; and electroplating a first fill layer on the seed layer. In one or more embodiments, the workpiece may include an opening. The dielectric barrier layer may be formed within the workpiece opening.

One or more embodiments relate to a method for forming a semiconductor structure, comprising: providing a workpiece; forming a dielectric barrier layer over the workpiece; forming an opening through the dielectric barrier layer; forming a seed layer over the dielectric barrier layer and within the dielectric barrier layer opening; and electroplating a first fill layer on the seed layer.

One or more embodiments relate to a method for forming a semiconductor structure, comprising: providing a workpiece; forming a dielectric barrier layer over the workpiece; forming an opening through the dielectric barrier layer; forming a seed layer over the dielectric barrier layer and within the dielectric barrier layer opening; forming a first masking layer over the seed layer and forming an opening through the first masking layer to expose the seed layer; electroplating a first fill layer on the seed layer within the first masking layer opening; forming a second masking layer over the first fill layer and forming an opening through the second masking layer to expose the first fill layer; and electroplating a second fill layer on the first fill layer within the second masking layer opening.

One or more embodiments relate to a semiconductor structure, comprising: a workpiece; a dielectric barrier layer overlying the workpiece, the dielectric barrier layer including a opening therethrough; a seed layer overlying the dielectric barrier layer and disposed within the dielectric barrier layer opening; and a first fill layer overlying the seed layer.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method for forming a semiconductor structure, comprising:
   providing a workpiece;
   forming a dielectric barrier layer over said workpiece;
   forming an opening through said dielectric barrier layer;
   forming a seed layer within said dielectric barrier layer opening;
   forming a first masking layer over said seed layer and forming an opening through said first masking layer to expose said seed layer;
   electroplating a first fill layer within said first masking layer opening;
   forming a second masking layer over said first fill layer and forming an opening through said second masking layer to expose said first fill layer;
   electroplating a second fill layer within said second masking layer opening; and
   removing said first and said second masking layers.

2. The method of claim 1, wherein said seed layer and/or said first fill layer and/or said second fill layer comprise Cu (copper).

3. The method of claim 2, wherein said Cu (copper) is copper metal and/or copper alloy.

4. The method of claim 1, wherein said dielectric barrier layer comprises at least one of oxide, nitride and oxynitride.

5. The method of claim 1, wherein said workpiece includes an opening, said barrier layer formed within said workpiece opening, said barrier layer opening formed within said workpiece opening.

6. The method of claim 1, wherein said seed layer comprises the element Cu (copper).

7. The method of claim 6, wherein said element Cu (copper) is in the form of copper metal and/or copper alloy.

8. The method of claim 1, wherein said seed layer comprises at least one element from the group consisting Cu (copper), Au (gold), Ag (silver) and Al (aluminum).

9. The method of claim 1, wherein said first masking layer comprises a photoresist material and said second masking layer comprises a photoresist material.

10. The method of claim 1, wherein said seed layer is formed directly on said barrier layer.

11. The method of claim 1, wherein said electroplating said first fill layer includes electroplating said first fill layer directly on said seed layer.

12. The method of claim 1, wherein said electroplating said second fill layer includes electroplating said second fill layer directly on said first fill layer.

13. The method of claim 1, wherein said first masking layer and said second masking layer are removed after said electroplating said second fill layer.

14. The method of claim 1, wherein said first masking layer is removed after said electroplating said first fill layer and before said forming said second masking layer, and wherein said second masking layer is removed after said electroplating said second fill layer.

15. The method of claim 1, wherein said first and said second fill layers are part of a final metallization level.

16. A method for forming a semiconductor structure, comprising:
   providing a workpiece;
   forming a dielectric barrier layer over said workpiece;
   forming an opening through said dielectric barrier layer;
   forming a seed layer within said dielectric barrier layer opening;
   forming a first photoresist layer over said seed layer and forming an opening through said first photoresist layer to expose said seed layer;
   electroplating a first fill layer within said first photoresist layer opening;
   forming a second photoresist layer over said first fill layer and forming an opening through said second masking layer to expose said first fill layer; and
   electroplating a second fill layer within said second masking layer opening.

17. The method of claim 16, wherein said seed layer and/or said first fill layer and/or said second fill layer comprise Cu (copper).

18. The method of claim 17, wherein said Cu (copper) is copper metal and/or copper alloy.

19. The method of claim 16, wherein said dielectric barrier layer comprises at least one of oxide, nitride and oxynitride.

20. The method of claim 16, wherein said workpiece includes an opening, said barrier layer formed within said workpiece opening, said barrier layer opening formed within said workpiece opening.

21. The method of claim 16, wherein said seed layer comprises the element Cu (copper).

22. The method of claim 21, wherein said element Cu (copper) is in the form of copper metal and/or copper alloy.

23. The method of claim 16, wherein said seed layer comprises at least one element from the group consisting Cu (copper), Au (gold), Ag (silver) and Al (aluminum).

24. The method of claim 16, wherein said electroplating said first fill layer electroplates said first fill layer directly on said seed layer.

25. The method of claim 16, wherein said electroplating said second fill layer electroplates said second fill layer directly on said first fill layer.

26. The method of claim 16, wherein said first masking layer and said second masking layer are removed after said electroplating said second fill layer.

27. The method of claim 16, wherein said first masking layer is removed after said electroplating said first fill layer and before said forming said second masking layer, and wherein said second masking layer is removed after said electroplating said second fill layer.

28. The method of claim 16, wherein said first and said second fill layers are part of a final metallization level.

* * * * *